United States Patent
Jonas et al.

(10) Patent No.: US 10,411,460 B2
(45) Date of Patent: *Sep. 10, 2019

(54) SYSTEM AND METHOD FOR AUTOMATICALLY RAMPING DOWN A SUPERCONDUCTING PERSISTENT MAGNET

(71) Applicant: KONINKLILJKE PHILIPS N.V., Eindhoven (NL)

(72) Inventors: Philip Alexander Jonas, Latham, NY (US); Gerardus Bernardus Jozef Mulder, Eindhoven (NL); Johannes Ferdinand Van Der Koijk, Eindhoven (NL); Viktor Mokhnatyuk, Latham, NY (US); Glen George Pfleiderer, Latham, NY (US); Philippe Abel Menteur, Latham, NY (US); Johannes Adrianus Overweg, Hamburg (DE); Michael Leslie Allitt, Latham, NY (US); Xiandrui Huang, Clifton, NY (US)

(73) Assignee: KONINKLIJKE PHILIPS N.V., Eindhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 15/990,858

(22) Filed: May 29, 2018

(65) Prior Publication Data

US 2018/0278044 A1 Sep. 27, 2018

Related U.S. Application Data

(63) Continuation of application No. 14/430,713, filed as application No. PCT/IB2013/058693 on Sep. 20, 2013, now Pat. No. 9,985,426.

(Continued)

(51) Int. Cl.
*H02H 7/00* (2006.01)
*G01R 33/3815* (2006.01)
(Continued)

(52) U.S. Cl.
CPC ......... *H02H 7/001* (2013.01); *G01R 33/3815* (2013.01); *H01F 6/003* (2013.01); *H01F 6/02* (2013.01); *G01R 33/3804* (2013.01)

(58) Field of Classification Search
CPC ........ H02H 7/001; H01H 47/22; H01H 47/32; H01H 47/325
(Continued)

(56) References Cited

U.S. PATENT DOCUMENTS

| 4,872,322 A | 10/1989 | Woods |
| 5,650,903 A | 7/1997 | Gross |

(Continued)

FOREIGN PATENT DOCUMENTS

| JP | 2001238864 A | 9/2001 |
| JP | 2005124721 A | 5/2005 |

(Continued)

*Primary Examiner* — Dharti H Patel

(57) ABSTRACT

An apparatus includes an electrically conductive coil which produces a magnetic field when an electrical current passes therethrough; a selectively activated persistent current switch connected across the electrically conductive coil; a cryostat having the electrically conductive coil and the persistent current switch disposed therein; an energy dump; at least one sensor which detects an operating parameter of the apparatus and outputs at least one sensor signal in response thereto; and a magnet controller. The magnet controller receives the sensor signal(s) and in response thereto detects whether an operating fault (e.g. a power loss to the compressor of a cryocooler) exists in the apparatus, and when an operating fault is detected, connects the energy dump unit across the electrically conductive coil to transfer energy from the electrically conductive coil to the energy (Continued)

dump unit. The energy dump unit disperses the energy outside of the cryostat.

20 Claims, 6 Drawing Sheets

Related U.S. Application Data

(60) Provisional application No. 61/706,160, filed on Sep. 27, 2012.

(51) Int. Cl.
*H01F 6/00* (2006.01)
*H01F 6/02* (2006.01)
*G01R 33/38* (2006.01)

(58) Field of Classification Search
USPC .......................................... 361/19
See application file for complete search history.

(56) References Cited

U.S. PATENT DOCUMENTS

| | | |
|---|---|---|
| 6,147,844 A | 11/2000 | Huang |
| 6,960,914 B2 | 11/2005 | Shen |
| 7,116,535 B2 | 10/2006 | Huang |
| 7,196,883 B2 | 3/2007 | Tsuchiya |
| 9,985,426 B2 * | 5/2018 | Jonas ................. G01R 33/3815 |
| 2007/0263328 A1 | 11/2007 | Jonas et al. |
| 2008/0079428 A1 | 4/2008 | Huang |
| 2008/0164877 A1 | 7/2008 | Huang et al. |
| 2011/0056218 A1 | 3/2011 | Blakes |
| 2012/0182012 A1 * | 7/2012 | Lvovsky ............ G01R 33/3815 324/318 |

FOREIGN PATENT DOCUMENTS

| | | |
|---|---|---|
| JP | 2005224441 A | 8/2005 |
| JP | 2008251564 A | 10/2008 |

* cited by examiner

SYSTEM AND METHOD FOR AUTOMATICALLY RAMPING DOWN A SUPERCONDUCTING PERSISTENT MAGNET

CROSS-REFERENCE TO PRIOR APPLICATIONS

This application claims the benefit or priority of and describes relationships between the following applications: wherein this application is a continuation of U.S. patent application Ser. No. 14/430,713, filed Mar. 24, 2015, which is the National Stage of International Application No. PCT/IB2013/058693, filed Sep. 20, 2013, which claims the priority of U.S. Provisional application 61/706,160 filed Sep. 27, 2012, all of which are incorporated herein in whole by reference.

TECHNICAL FIELD

This invention pertains to superconducting persistent magnets, and in particular, to a system and method for automatically ramping down a superconducting persistent magnet.

BACKGROUND AND SUMMARY

Superconducting magnets are typically used in a variety of contexts, including nuclear magnetic resonance (NMR) analysis and magnetic resonance imaging (MRI). To realize superconductivity, the magnet is maintained in a cryogenic environment at a temperature near absolute zero. Typically, the magnet comprises an electrically conductive coil which is disposed in a cryostat containing a volume of a cryogenic fluid such as liquid helium. Many such superconducting magnets operate in "persistent mode." A magnet operating in persistent mode is initially energized with current from an external power supply to start up its magnetic field. The power supply is then disconnected from the magnet. The current and the magnetic field are maintained due to the magnet's superconductivity.

Although a continuous supply of power is not required to sustain the magnetic field, power (e.g., AC Mains power) are typically supplied to a compressor, which drives a cooling unit or "cold head" that maintains the temperature in the cryostat near absolute zero so that the magnet's superconductivity can persist.

In the event of a power loss to the compressor, the cold head may cease to operate and conditions within the cryostat can degrade, i.e., the temperature of the magnet can begin to rise. If power is not reapplied to restore cooling of the magnet's environment, the magnet's temperature may rise to a critical temperature where the magnet will "quench" and convert its magnetic energy to heat energy, thereby heating the cryogenic fluid within the cryostat. This "quench" can cause some or all of the cryogenic fluid to evaporate and be lost, for example, through a pressure relieve valve. Furthermore, the heat may damage the magnet and/or other components of the system.

Once power is restored, returning the magnet to superconducting operation may require: replacing the lost cryogenic fluid within the cryostat, cooling the magnet to below the critical temperature, and regenerating the magnetic field. Furthermore, if heat from the quench caused the magnet or other components to be damaged, they may need to be repaired or replaced.

This recovery process can be expensive and time-consuming. Typically, a trained technician must be dispatched to the facility (e.g., a medical center or hospital) where the superconducting magnet system is located and new cryogenic fluid (e.g. liquid helium), which may be quite costly, must be supplied to the cryostat.

Nevertheless, MRI systems typically employ relatively large volumes of cryogenic fluid (e.g., 1000 liters of liquid helium), which can at least partially ameliorate such a situation. This large volume of cryogenic fluid has a large thermal mass which can prevent the magnet from reaching the critical temperature for extend periods—possibly even days. Furthermore, such a superconducting magnet system typically provides access by which a user may add cryogenic fluid to the cryostat to replace lost or evaporated cryogenic material.

However, some newer MRI systems employ so-called "cryofree" superconducting magnet systems which are closed or sealed and do not include any means for a user to add new cryogenic material to the system. Furthermore, such closed systems typically have a smaller volume of cryogenic material when compared with conventional systems as described above (e.g., one liter of liquid helium). Accordingly, quench may occur in a relatively short amount of time (e.g., several hours) after a power failure to the compressor. Furthermore, since the systems typically do not allow additional cryogens to be added, if the cryogenic liquid is degraded or evaporated due to a quench, recovery may not be possible.

In one exemplary embodiment of the present invention, an apparatus can be provided, comprising, for example: an electrically conductive coil configured to produce a magnetic field when an electrical current is passed therethrough; a persistent current switch connected across the electrically conductive coil and configured to be selectively activated and deactivated; a cryostat having the electrically conductive coil and the persistent current switch disposed therein; an energy dump unit; at least one sensor configured to detect an operating parameter of the apparatus and to output at least one sensor signal in response thereto; and a magnet controller configured to receive the at least one sensor signal and in response thereto to detect whether an operating fault exists in the apparatus, and when the operating fault is detected, to connect the energy dump unit across the electrically conductive coil by the first and second electrically conductive leads so as to transfer energy from the electrically conductive coil to the energy dump unit, which disperse the energy outside of the cryostat.

In some embodiments, the energy dump unit is disposed outside of the cryostat and is physically connected to the cryostat so as to transfer heat from the energy dump unit to the cryostat.

In some embodiments, the apparatus further comprises at least one cooling fan which is supplied by a voltage across the energy dump unit and which is activated when the energy dump unit is connected across the electrically conductive coil in response to the detection of the operating fault.

In some embodiments, the apparatus further comprises first and second electrically conductive leads which are retractable and extendable under control of the magnet controller, and are configured in a retracted position to be disposed substantially entirely outside the cryostat and in an extended position to extend into the cryostat; and third and fourth electrically conductive leads disposed within the cryostat and connected to opposite ends of the electrically conductive coil. The magnet controller is configured to extend the first and second electrically conductive leads to be engaged with, and electrically connected to, the third and fourth electrically conductive leads, respectively, in response to detecting that an operating fault exists in the apparatus, and the first and second electrically conductive leads are connected to the energy dump unit.

In some embodiments, the apparatus further comprises: a cryogenic heat shield disposed within the cryostat; first and second electrically conductive leads; and third and fourth electrically conductive leads disposed within the cryostat and connected to opposite ends of the electrically conductive coil. Each of the third and fourth electrically conductive leads comprises a material which is superconducting at a temperature above 50° K. The third and fourth electrically conductive leads are anchored thermally to the cryogenic heat shield. The first and second electrically conductive leads is configured to be connected to the third and fourth electrically conductive leads, respectively, under control of the magnet controller in response to detecting that an operating fault exists in the apparatus, and the first and second electrically conductive leads are connected to the energy dump unit.

In some embodiments, the apparatus further comprises a switch configured to selectively connect one of the first and second electrically conductive leads to the energy dump unit in response to a control signal from the magnet controller In some embodiments, the apparatus further comprises first and second electrically conductive leads configured to connect the energy dump unit across the electrically conductive coil, and the first and second electrically conductive leads have first ends permanently disposed inside of the cryostat, and further have second ends permanently disposed outside of the cryostat.

In some embodiments, the apparatus further comprises: a cold head configured to cool the cryostat; a compressor configured to drive the cold head; an inner chamber within the cryostat; and a thermal insulation region disposed between an outer wall of the cryostat and the inner chamber. The sensor(s) includes at least one of: a first temperature sensor configured to measure a temperature of the electrically conductive coil, a second temperature sensor configured to measure a temperature of the cold head, a third temperature sensor configured to measure a temperature in the thermal insulation region, a sensor configured to monitor a level of cryogenic fluid within the cryostat, and a sensor configured to determine if the compressor is properly driving the cold head.

In some embodiments, the apparatus further comprises: a cold head configured to cool the cryostat; a compressor configured to drive the cold head; an inner chamber within the cryostat; and a thermal insulation region disposed between an outer wall of the cryostat and the inner chamber. The sensor(s) includes: a first temperature sensor configured to measure a temperature of the electrically conductive coil, a second temperature sensor configured to measure a temperature of the cold head, a third temperature sensor configured to measure a temperature in the thermal insulation region, a sensor configured to monitor a level of cryogenic fluid within the cryostat, and a sensor configured to determine if the compressor is properly driving the cold head.

In some embodiments, the apparatus further comprises: a cold head configured to cool the cryostat; a compressor configured to drive the cold head, the compressor configured to receive power from AC Mains; and a backup power supply configured to supply power to the magnet controller when AC Mains incurs a power outage.

In some embodiments, the apparatus is a magnetic resonance imaging (MRI) apparatus. The MRI apparatus further comprises: a patient table configured to hold a patient; gradient coils configured to at least partially surround a portion of a patient for which the MRI apparatus generates an image; a radio frequency coil configured to apply a radio frequency signal to the portion of a patient and to alter the alignment of this magnetic field; and a scanner configured to detect changes in the magnetic field caused by the radio frequency signal.

In some embodiments, the apparatus further comprises: a closed system within the cryostat having a cryogenic fluid disposed therein; and a cold head configured to cool the cryogenic fluid within the closed system.

In another aspect of the invention, a method can be provided for operating a magnet system including an electrically conductive coil disposed in a cryostat. The method can comprise, for example: generating a persistent magnetic field by the electrically conductive coil; monitoring at least one sensor signal produced by at least one sensor in the magnet system; and in response to the at least one sensor signal, detecting by a magnet processor whether an operating fault exists in the magnet system. When the operating fault is detected, an energy dump unit is automatically connected across the electrically conductive coil so as to transfer energy from the electrically conductive coil to the energy dump unit, and a heater in the persistent current switch connected across the electrically conductive coil is activated.

In some embodiments, the sensor signal(s) is produced by at least one of: a first temperature sensor configured to measure a temperature of the electrically conductive coil, a second temperature sensor configured to measure a temperature of a cold head configured to cool the cryostat, a third temperature sensor configured to measure a temperature in a thermal insulation region between an inner chamber of the cryostat and an outer wall of the cryostat, a sensor configured to monitor a level of cryogenic fluid within the cryostat, and a sensor configured to determine if a compressor configured to drive the cold head is properly driving the cold head.

In some embodiments, the sensor signal(s) is produced by: a first temperature sensor configured to measure a temperature of the electrically conductive coil, a second temperature sensor configured to measure a temperature of a cold head configured to cool the cryostat, a third temperature sensor configured to measure a temperature in a thermal insulation region between an inner chamber of the cryostat and an outer wall of the cryostat, a sensor configured to monitor a level of cryogenic fluid within the cryostat, and a sensor configured to determine if a compressor configured to drive the cold head is properly driving the cold head.

In some embodiments, the magnet system can include first and second electrically conductive leads which are retractable and extendable, each of the first and second electrically conductive leads being configured in a retracted position to be disposed substantially entirely outside the cryostat, and in an extended position to extend into the cryostat, and third and fourth electrically conductive leads, respectively, which are disposed within the cryostat and which are connected to opposite ends of the electrically conductive coil. Automatically connecting the energy dump unit across the electrically conductive coil can include extending the first and second electrically conductive leads to be engaged with and electrically connected to, the third and fourth electrically conductive leads.

In some embodiments, the magnet system can include first and second electrically conductive leads which have first ends disposed inside of the cryostat and connected to opposite ends of the electrically conductive coil, and further have second ends disposed outside of the cryostat, and automatically connecting the energy dump unit across the electrically conductive coil comprises selectively connecting one of the first and second electrically conductive leads to the energy dump unit in response to a control signal from the magnet controller.

In yet another aspect of the invention, a magnet system is provided. The magnet system comprises: an electrically conductive coil configured to produce a magnetic field when an electrical current is passed therethrough; a persistent current switch connected across the electrically conductive coil and configured to be selectively activated and deactivated; a cryostat having the electrically conductive coil and the persistent current switch disposed therein; an energy dump unit; at least one sensor configured to detect an operating parameter of the apparatus and to output at least one sensor signal in response thereto; and a magnet controller The magnet controller is configured to monitor the at least one sensor signal, and in response to the at least one sensor signal, detect whether an operating fault exists in the magnet system. When the operating fault is detected, the energy dump unit is automatically connected across the electrically conductive coil so as to transfer energy from the electrically conductive coil to the energy dump unit, and a heater in the persistent current switch is activated.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided as teaching examples of the invention.

Figure 1:
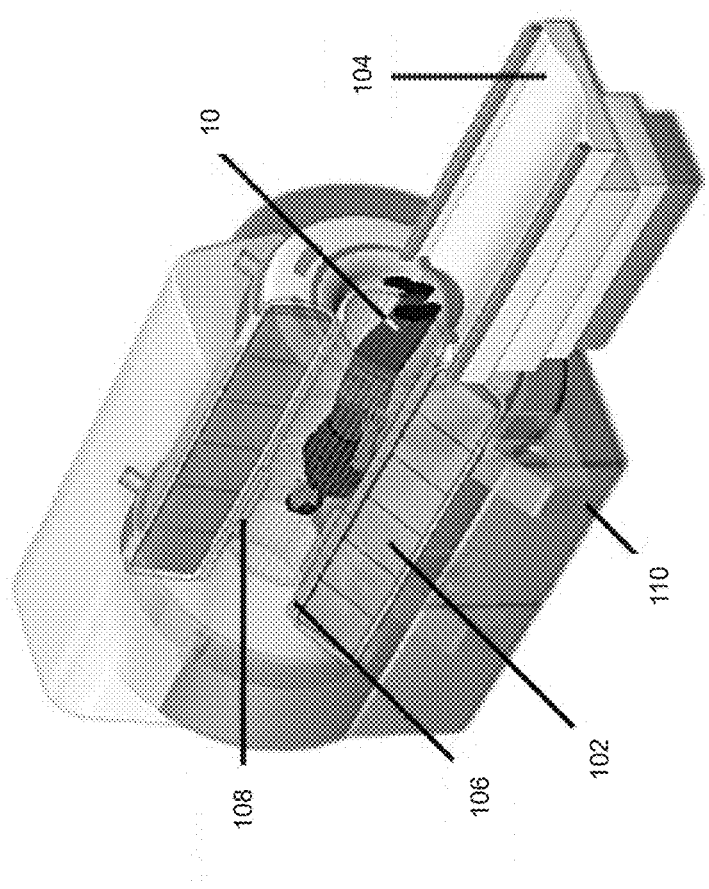
FIG. 1 illustrates one exemplary embodiment of a magnetic resonance imaging (MRI) apparatus.

FIG. 1 illustrates one exemplary embodiment of a magnetic resonance imaging (MRI) apparatus 100. MRI apparatus 100 can include, for example, a magnet 102; a patient table 104 configured to hold a patient 10; gradient coils 106 configured to at least partially surround at least a portion of patient 10 for which MRI apparatus 100 generates an image; a radio frequency coil 108 configured to apply a radio frequency signal to at least the portion of patient 10 which is being imaged, and to alter the alignment of this magnetic field; and a scanner 110 configured to detect changes in the magnetic field caused by the radio frequency signal.

The general operation of an MRI apparatus is well known and therefore will not be repeated here.

Figure 2:
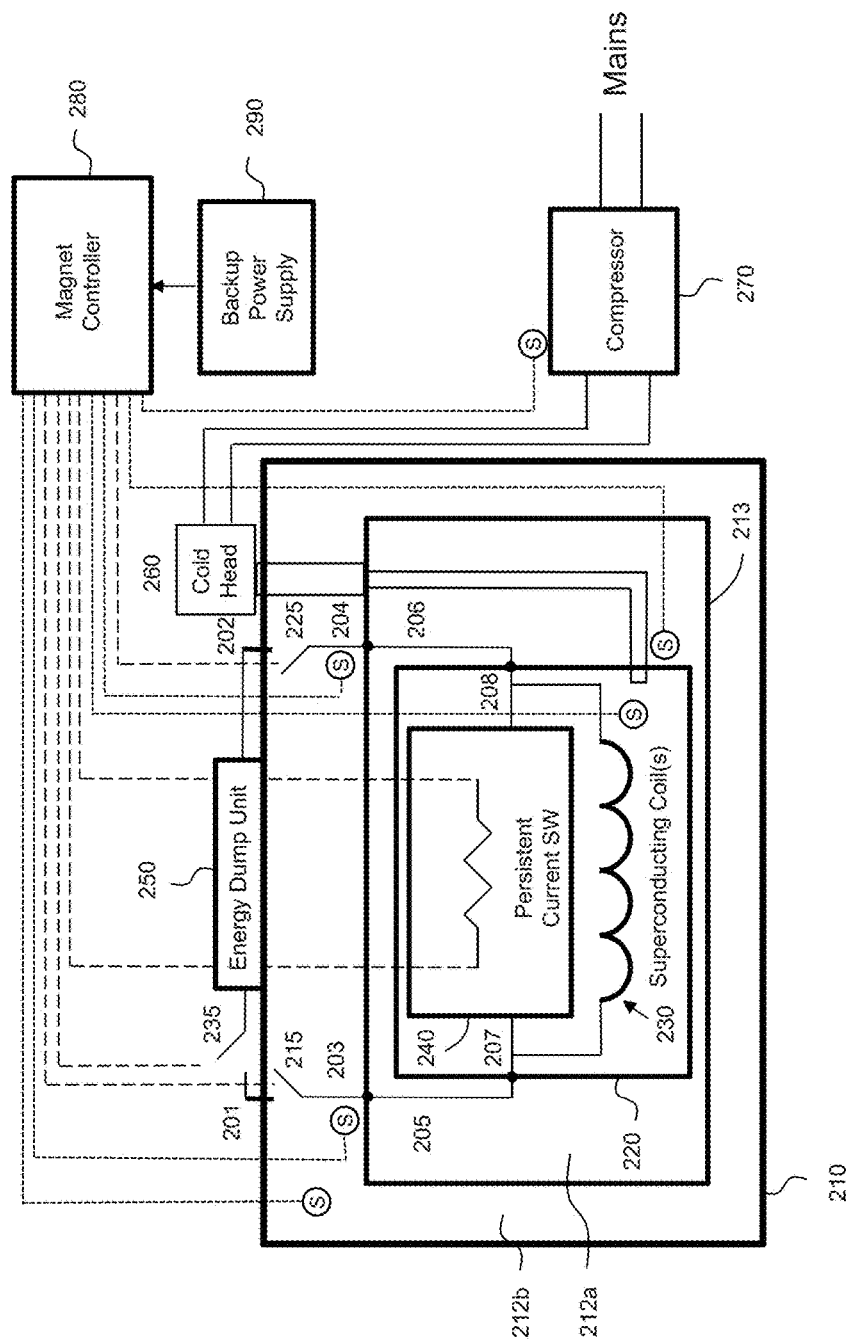
FIG. 2 illustrates one exemplary embodiment of a superconducting magnet system which may be employed in an MRI apparatus.

FIG. 2 illustrates one exemplary embodiment of a superconducting magnet system 200 which may be employed in an MRI apparatus. In particular, superconducting magnet system 200 may be one embodiment of magnet 102 in MRI apparatus 100.

Superconducting magnet system 200 can include a cryostat 210, an inner chamber 220 within cryostat 210, and a thermal shield 213 disposed between inner chamber 220 and the outer wall or enclosure of cryostat 210. Superconducting magnet system 200 can also include an electrically conductive coil 230 and a persistent current switch 240 disposed within inner chamber 220 of cryostat 210, and an energy dump unit 250 disposed outside of (external to) cryostat 210. Superconducting magnet system 200 further can include a cold head 260 driven by a compressor 270 to cool cryostat 210, a magnet controller 280, and a backup power supply 290 for supplying power to magnet controller 270 when a main source of power (e.g., AC Mains) is lost due to a power outage or interruption. Superconducting magnet system 200 further can include first and second electrically conductive leads 201 and 202, third and fourth electrically conductive leads 203 and 204, fifth and six electrically conductive leads 205 and 206, seventh and eighth electrically conductive leads 207 and 208, a switch 235, and a variety of sensors, as will be discussed in more detail below.

In some embodiments, thermal shield 213 can define first and second thermal insulation regions 212a and 212b, each of which may be an evacuated space where any, gas, liquid, etc. has been removed, comprising a vacuum except for the areas occupied by the electrically conductive leads and any switches and sensors (discussed below), etc. When inner chamber 220 is filled with liquid helium, for example, the temperature of inner chamber would preferably be about 4.2° K. Furthermore, the temperature of thermal shield 213 may be about 50° K. In that case, if ambient room temperature outside cryostat 210 is 300° K, for example, then the temperature drop across the space defined by first thermal insulation region 212a may be in a range from about 4.2° K to about 50° K, and the temperature drop across the space defined by second thermal insulation region 212b may be in a range from about 50° K to about 300° K.

Persistent current switch 240 can be disposed within inner chamber 220 and may comprise a superconductor wire connected across opposite ends of electrically conductive coil 230 via seventh and eighth electrically conductive leads 207 and 208, attached to a small heater.

Superconducting magnet system 200 may include one or more of the following sensors: a first temperature sensor configured to measure a temperature of electrically conductive coil 230, a second temperature sensor configured to measure a temperature of cold head 260, a third temperature sensor configured to measure a temperature in thermal insulation region 212, a sensor configured to measure a level of cryogenic fluid (e.g., liquid helium) disposed within inner chamber 220 of cryostat 210, and a sensor configured to determine if compressor 270 is properly driving cold head 260, including, for example, a sensor configured to determine whether AC Mains power is being supplied to compressor 270, or whether the power has been lost, for example, due to an electrical power outage. Each sensor is connected to magnet controller 280 and supplies a corresponding sensor signal to magnet controller 280.

Magnet controller 280 may comprise a processor and memory, including nonvolatile memory and volatile memory. The nonvolatile memory may store programming code or instructions (software) for causing the processor to execute one or more algorithms for controlling operations of superconducting magnet system 280, as described in greater detail below. Magnet controller 280 may also be connected to, and control operations of, switch 235 and first and second electrically conductive leads 202 and 204.

In some embodiments, fifth and sixth electrically conductive leads 205 and 206 each may be low-loss leads which conduct a minimal amount of external heat to inner chamber 220 of cryostat 210. Beneficially, fifth and sixth electrically conductive leads 205 and 206 each may be made of a material which experiences superconductivity at a relatively high temperature, for example, at a temperature greater than 50° K, and in particular at or around 77° K. Beneficially, third and fourth electrically conductive leads 203 and 204, and fifth and sixth electrically conductive leads 205 and 206, may be anchored thermally to thermal shield 213. In some embodiments, third and fourth electrically conductive leads 203 and 204 may be made of copper or brass.

In one embodiment, superconducting magnet system 200 can include first and second switches 215 and 225 disposed in cryostat 210 and configured to be controlled by magnet controller 280 to selectively connect first and second electrically conductive leads 201 and 202 to third and fourth electrically conductive leads 203 and 204, respectively, as explained in greater detail below.

In another embodiment of superconducting magnet system 200, first and second electrically conductive leads 201 and 202 may each be retractable leads which are retractable and extendable under control of magnet controller 280. Each of first and second electrically conductive leads 201 and 202 is configured in a retracted position to be disposed entirely outside, or substantially entirely outside, of cryostat 210, and in an extended position to extend into cryostat 210 and be engaged with, and be electrically connected to third and fourth electrically conductive leads 203 and 204 (for example via contact or transfer switches 215 and 225).

When operational, cryostat 210, and particularly inner chamber 220, contains a cryogenic fluid; for example liquid helium. In particular, electrically conductive coil 230 and persistent current switch 240 may be immersed in the cryogenic fluid. Compressor 270 receives electrical power (e.g., from AC Mains) and drives cold head 260 to maintain cooling of the cryogenic fluid in cryostat 210.

During an exemplary startup operation of superconducting magnet system 200, the wire in persistent current switch 240 is heated above its transition temperature, so that it becomes resistive. Magnet controller 280 closes switch 235 and connects first and second electrically conductive leads 201 and 203 to third and fourth electrically conductive leads 203 and 204, respectively, and thereby connects an external power supply to electrically conductive coil 230 (e.g., via fifth, sixth, seventh and eighth electrically conductive leads 205, 206, 207 and 208). In some embodiments, magnet controller 280 extends first and second electrically conductive leads 201 and 202 into cryostat 210 to be engaged with, and electrically connected to, third and fourth electrically conductive leads 203 and 204 (for example via contact or transfer switches 215 and 225). In other embodiments, magnet controller 280 closes first and second switches 215 and 225 to connect first and second electrically conductive leads 201 and 202 to third and fourth electrically conductive leads 203 and 204.

In some embodiments, the external power supply may include some or all of the components of energy dump unit 250.

Electrically conductive coil 230 is initially energized by the external power supply. Since the wire in persistent current switch 240 is being heated during the startup operation, its resistance is substantially greater than that of electrically conductive coil 230 so the current from the external power supply passes through electrically conductive coil 230. As electrically conductive coil 230 is immersed in the cryogenic fluid (e.g., liquid helium) in inner chamber 210, electrically conductive coil 230 is superconducting and thus functions as a superconducting magnet.

To go to persistent mode, the current through electrically conductive coil 230 is adjusted until the desired magnetic field is obtained, then the heater in persistent current switch 240 is turned off. After the heater is turned off, the superconductor wire in persistent current switch 240 cools to its superconducting temperature, short-circuiting electrically conductive coil 230, which as mentioned above is also superconducting. Magnet controller 280 then disconnects first and second electrically conductive leads 201 and 203 from third and fourth electrically conductive leads 203 and 204, respectively, and thereby disconnects the external power supply from electrically conductive coil 230. In some embodiments, magnet controller 280 retracts first and second electrically conductive leads 202 and 204 from cryostat 210 to be disengaged from, and electrically disconnected from third and fourth electrically conductive leads 203 and 204. In other embodiments, magnet controller 280 opens first and second switches 215 and 225 to disconnect first and second electrically conductive leads 201 and 202 from third and fourth electrically conductive leads 203 and 204. At this time magnet controller 280 may also open switch 235.

During normal operation, magnet controller 280 monitors one or more sensors in superconducting magnet system 200 to determine whether or not there is an operating fault or malfunction in superconducting magnet system 200 such that a quench may occur. For example, superconducting magnet system may monitor signals from one or more of the following sensors: a first temperature sensor configured to measure a temperature of electrically conductive coil 230, a second temperature sensor configured to measure a temperature of cold head 260, a third temperature sensor configured to measure a temperature in thermal insulation region 212, a sensor configured to measure a level of cryogenic fluid (e.g., liquid helium) disposed within inner chamber 220 of cryostat 210, and a sensor configured to measure a level of and a sensor configured to determine if compressor 270 is properly driving cold head 260, including for example a sensor configured to determine whether AC Mains power is being supplied to compressor 270, or whether the power has been lost, for example due to an electrical power outage.

Magnet controller 280 is configured and programmed such that when a malfunction or operating fault in superconducting magnet system 200 is detected by magnet controller 280 via the sensor signals of the sensors in superconducting magnet system 200, magnet controller 280 initiates an automatic ramp down sequence for superconducting magnet system 200 to prevent a quench and thereby avoid degrading or losing cryogenic materials in cryostat 210 and/or damaging electrically conductive coil 230 and/or other components of superconducting magnet system 200.

In superconducting system 200, the automatic ramp down sequence may include magnet controller 280 closing switch 235 and connecting first and second electrically conductive leads 201 and 203 to third and fourth electrically conductive leads 203 and 204, respectively. In some embodiments, magnet controller 280 extends first and second electrically conductive leads 201 and 202 into cryostat 210 to be engaged with, and electrically connected to, third and fourth electrically conductive leads 203 and 204 (for example via contact or transfer switches 215 and 225). In other embodiments, magnet controller 280 may close first and second switches 215 and 225 to connect first and second electrically conductive leads 201 and 202 to third and fourth electrically conductive leads 203 and 204. As a result, energy dump unit 250 is connected across the opposite ends of electrically conductive coil 230 (e.g., via fifth, sixth, seventh and eighth electrically conductive leads 205, 206, 207 and 208). In this case, the energy dump unit 250 is connected in parallel with the wire in persistent current switch 240.

Then, magnet controller 280 activates the heater in persistent current switch 240 so as to heat the wire in persistent current switch 240 and thereby increase its resistance to be greater, and beneficially substantially greater, than the impedance of energy dump unit 250. As a result of these steps, a circuit is formed with electrically conductive coil 230 and energy dump unit 250 so that the magnetic energy of electrically conductive coil 230 is discharged through energy dump unit 250 which is disposed external to cryostat 210. In some embodiments, energy dump unit 250 includes one or more diodes and/or resistors which generate heat energy from the current provided by electrically conductive coil 230 as it converts its magnetic energy. Beneficially, energy dump unit 250 is designed to dissipate the magnetic energy of electrically conductive coil 230 as heat in a controlled manner.

Via the ramp down procedure described above, magnetic energy from electrically conductive coil 230 may be transferred to heat energy which is dissipated outside of cryostat 210 in a controlled manner, thereby avoiding a quench.

Figure 3:
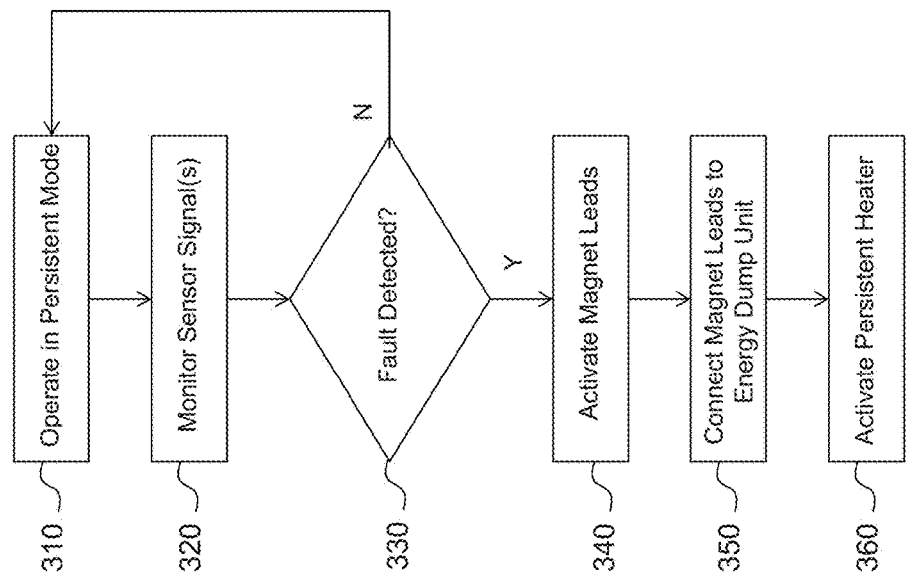
FIG. 3 is a flowchart illustrating an exemplary method of operating and automatically ramping down a superconducting persistent magnet.

FIG. 3 is a flowchart illustrating an exemplary method 300 of operating and automatically ramping down a superconducting persistent magnet in a magnet system such as superconducting magnet system 200. In some embodiments, method 300 may be implemented by a processor of a magnet controller executing one or more software-implemented algorithms.

In operation 310, a superconducting magnet operates in persistent mode.

In operation 320, a magnet controller monitors one or more sensor signals of the magnet system.

In operation 330, the magnet controller determines, for example, by analyzing the one or more sensor signals, whether or not a fault or malfunction is detected. In particular, the magnet controller determines whether a fault or malfunction indicating that a quench is occurring or may be impending. If no fault is detected, then the method repeats operations 310 and 320.

If the magnet controller detects a fault or malfunction in the magnet system, particularly a fault or malfunction which indicates that a quench is or may be impending, then in operation 340 the magnet controller activates a pair of electrically conductive leads for the magnet systems. For example, the magnet controller can extend conductive leads into a cryostat where the superconducting magnet is disposed. As will be described in more detail below, in some embodiments of a magnet system, the magnet leads may be permanently "activated," and in such embodiments operation 340 may be omitted.

In operation 350, the magnet controller connects an energy dump unit, which is located outside of or external to the cryostat, across the opposite end of the electrically conductive coil of the superconducting magnet via the pair of electrically conductive leads. For example, this can be accomplished by connecting one or more switches which connects one or both of the electrically conductive leads to the energy dump unit.

Subsequently, in operation 360 the magnet controller activates a heater in a persistent current switch which is disposed in the cryostat in parallel with the energy dump unit. As a result of the activation of the heater, the resistance of the wire in the persistent current switch is increased to be greater, and beneficially substantially greater, than the impedance of the energy dump unit. Accordingly, as the electrically conductive coil discharges its magnetic field, most—and beneficially substantially all—of the current passing through the electrically conductive coil is provided to the energy dump unit which is located outside of the cryostat, where it is converted to heat.

By this process, a quench within the cryostat may be prevented, thereby avoiding damage to the cryogenic materials and/or the electrically conductive coils within the cryostat.

In some embodiments of a superconducting magnet system, energy dump unit 250 may generate a significant amount of heat during a ramp down procedure, and cooling may be required.

Accordingly, in superconducting magnet system 200, energy dump unit 250 may be physically connected to cryostat 210 (either directly connected or connected via one or more intermediate elements) so that cryostat 210 may act as a heat sink for energy dump unit 250.

Figure 4:
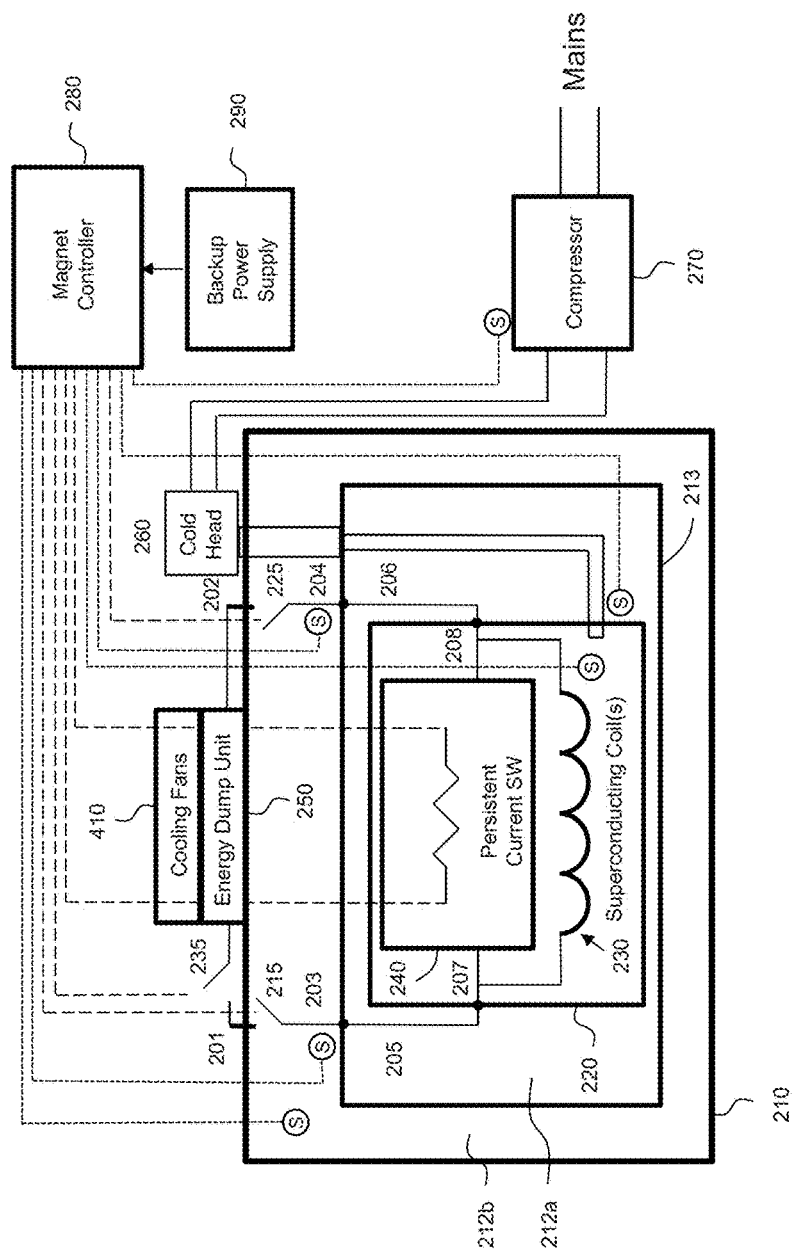
FIG. 4 illustrates another exemplary embodiment of a superconducting magnet system which may be employed in an MRI apparatus.

FIG. 4 illustrates another example embodiment of a superconducting magnet system 400 which may be employed in an MRI apparatus and which includes one or more cooling fans 410 for cooling energy dump unit 250. Beneficially, cooling fan(s) 410 may be supplied with power for operation by a voltage across energy dump unit 250 and is/are activated when energy dump unit 250 is connected across electrically conductive coil 230 by first and second electrically conductive leads 201 and 202 in response to the detection of a malfunction and operating fault in superconducting magnet system 400.

Other than the cooling fan(s) 410, superconducting magnet system 400 can be the same as superconducting magnet system 200.

Figure 5:
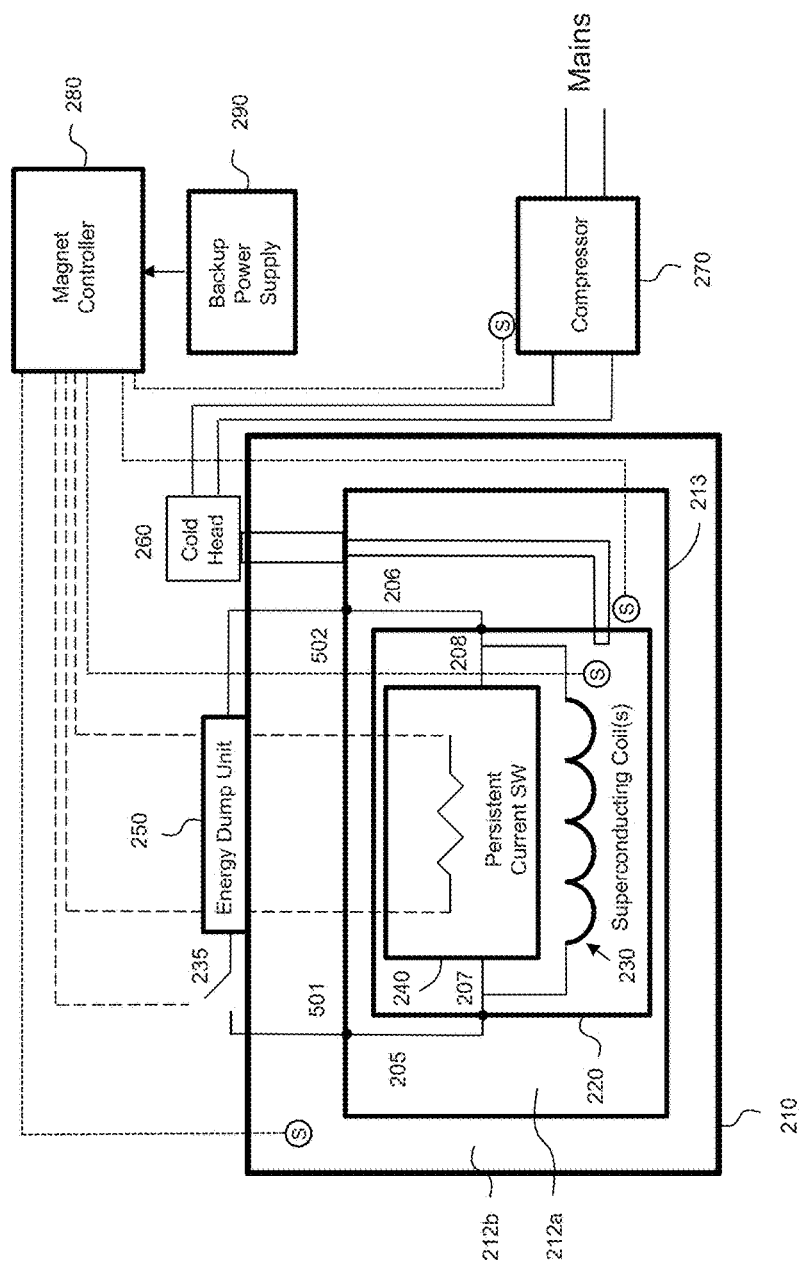
FIG. 5 illustrates yet another exemplary embodiment of a superconducting magnet system which may be employed in an MRI apparatus.

FIG. 5 illustrates yet another example embodiment of a superconducting magnet system 500 which may be employed in an MRI apparatus.

Superconducting magnet system 500 is similar to superconducting magnet system 200, and only those portions of superconducting magnet system 500 which differ from superconducting magnet system 200 will be described here.

In particular, superconducting magnet system 500 is the same as superconducting magnet system 200, except that: (1) superconducting magnet system 500 does not include third and fourth electrically conductive leads 203 and 204 and first and second switches 215 and 225; and (2) superconducting magnet system 500 includes first and second electrically conductive leads 501 and 502. Conductive leads 501 and 502 can include first ends disposed within cryostat 210 and permanently connected across opposite ends of electrically conductive coil 230 (e.g., via fifth, sixth, seventh and eighth electrically conductive leads 205, 206, 207 and 208). Further, conductive leads 501 and 502 can include second ends permanently disposed outside of cryostat 210. Only those portions of superconducting magnet system 500 and its operation which differ from superconducting magnet system 200 will be described here.

Beneficially, as described above, electrically conductive leads 205 and 206 are low-loss leads which conduct a minimal amount of external heat into cryostat 210. Beneficially, electrically conductive leads 205 and 206 which are disposed in thermal insulation region 212a may be made of a material which experiences superconductivity at a relatively high temperature, for example a temperature greater than 50° K, and in particular at or around 77° K. Beneficially, electrically conductive leads 205 and 206 each are thermally anchored to thermal shield 213.

During normal operation after start-up, magnet controller 280 controls opens switch 235 to disconnect energy dump unit 250 from electrically conductive coil 230 so that electrically conductive coil 230, which is superconducting, operates in persistent mode with the superconducting wire in persistent current switch 240.

When an automatic ramp down sequence is initiated by magnet controller 280 (for example due to a detected fault or malfunction), then magnet controller 280 closes switch 235, thereby connecting energy dump unit 250 across the opposite ends of electrically conductive coil 230. Then, as with superconducting magnet system 200, magnet controller 280 activates the heater in persistent current switch 240 to increase the resistance of the superconductor wire in persistent current switch 240, thereby diverting the current from electrically conductive coil 230 to energy dump unit 250. Although only a single switch 235 is shown in FIG. 6 for selectively connecting first electrically conductive lead 501 to energy dump unit 250, alternatively, a second switch 235 may also be provided for connecting second electrically conductive lead 502 to energy dump unit 250.

Figure 6:
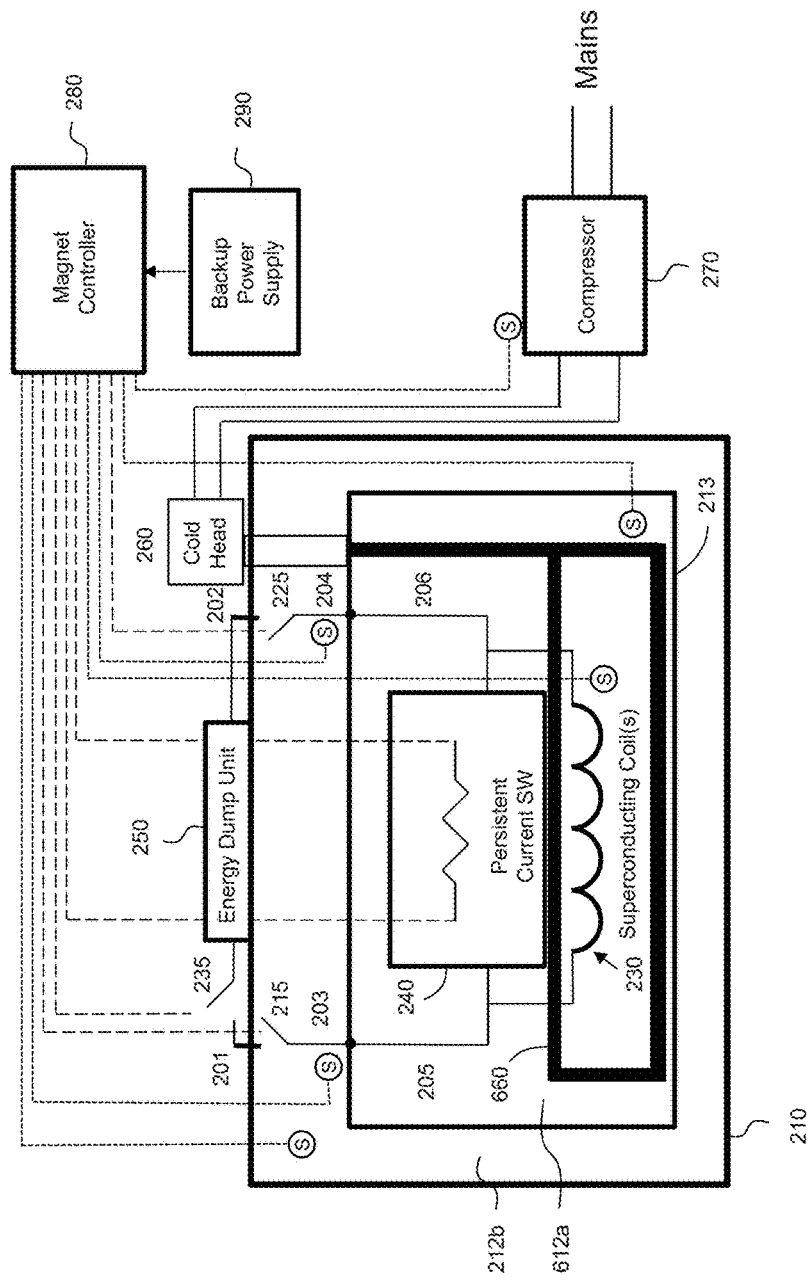
FIG. 6 illustrates still another exemplary embodiment of a superconducting magnet system which may be employed in an MRI apparatus.

FIG. 6 illustrates yet another exemplary embodiment of a superconducting magnet system 600 which may be employed in an MRI apparatus.

Superconducting magnet system 600 is similar to superconducting magnet system 200, and only those portions of superconducting magnet system 600 which differ from superconducting magnet system 200 will be described here.

Superconducting magnet system 600 is a "cryofree" system or sealed system wherein cryostat 210 is not provided with means to add cryogenic material (e.g., liquid helium) thereto. Accordingly, inner chamber 220 of superconducting magnet system 600 is not filled with a cryogenic fluid, and instead, superconducting magnet system 600 includes a cold plate 660 which is connected to, and cooled by, cold head 260. Beneficially, cold plate 660 may be a closed system which is filled with and may circulate a cryogenic fluid, for example liquid helium.

In some embodiments, cryostat 210 may contain only a relatively small amount of cryogenic fluid in cold plate 660, for example, one or two liters or less of liquid helium. In that case, it is understood that the time between when a malfunction or operating fault occurs (e.g., a power loss to compressor 270) and when quench occurs may be relatively small (e.g., several hours or less).

Although not specifically illustrated in the drawings, it should be understood that other embodiments of a superconducting magnet system with different variations are possible. For example, in one embodiment the superconducting magnet system may include the cooling fans(s) of superconducting magnet system 400 and the permanent first and second electrically conductive leads of superconducting magnet system 500. In another embodiment, a cryofree superconducting magnet system may include the cooling fans(s) of superconducting magnet system 400 and/or the permanent first and second electrically conductive leads of superconducting magnet system 500. Other variations are conceived.

While preferred embodiments are disclosed herein, many variations are possible which remain within the concept and scope of the invention. Such variations would become clear to one of ordinary skill in the art after inspection of the specification, drawings and claims herein.

What is claimed is:

1. An apparatus comprising:
   an electrically conductive coil configured to produce a magnetic field when an electrical current is passed therethrough;
   a persistent current switch connected across the electrically conductive coil and configured to be selectively activated and deactivated;
   a cryostat having the electrically conductive coil and the persistent current switch disposed therein;
   an energy dump unit;
   at least one sensor configured to detect an operating parameter of the apparatus and to output at least one sensor signal in response thereto;
   a magnet controller configured to receive the at least one sensor signal and in response thereto to detect whether an operating fault exists in the apparatus, and when the operating fault is detected, to connect the energy dump unit across the electrically conductive coil so as to transfer energy from the electrically conductive coil to the energy dump unit in order to prevent a quench of the apparatus;
   first and second electrically conductive leads which are retractable and extendable under control of the magnet controller, and are configured in a retracted position to be disposed substantially entirely outside the cryostat and in an extended position to extend into the cryostat; and
   third and fourth electrically conductive leads disposed within the cryostat and connected to opposite ends of the electrically conductive coil,
   wherein the magnet controller is configured to extend the first and second electrically conductive leads to be engaged with, and electrically connected to, the third and fourth electrically conductive leads, respectively, in response to detecting that an operating fault exists in the apparatus, wherein the first and second electrically conductive leads are connected to the energy dump unit and to retract the first and second conductive leads to disengage the third and fourth electrically conductive leads, respectively, in the absence of an operating fault.

2. The apparatus of claim 1, wherein the energy dump unit disperses the energy outside of the cryostat.

3. The apparatus of claim 1, wherein the energy dump unit is disposed outside of the cryostat and is physically connected to the cryostat so as to transfer heat from the energy dump unit to the cryostat.

4. The apparatus of claim 1, wherein the at least one sensor is a temperature sensor.

5. The apparatus of claim 1, wherein the third and fourth leads are constructed of a material which is superconducting at a temperature above 50° K.

6. An apparatus comprising:
   an electrically conductive coil configured to produce a magnetic field when an electrical current is passed therethrough;
   a persistent current switch connected across the electrically conductive coil and configured to be selectively activated and deactivated;

a cryostat having the electrically conductive coil, the persistent current switch, and a cryogenic heat shield disposed therein;
an energy dump unit;
at least one sensor configured to detect an operating parameter of the apparatus and to output at least one sensor signal in response thereto;
a magnet controller configured to receive the at least one sensor signal and in response thereto to detect whether an operating fault exists in the apparatus, and when the operating fault is detected, to connect the energy dump unit across the electrically conductive coil so as to transfer energy from the electrically conductive coil to the energy dump unit in order to prevent a quench of the apparatus;
first and second electrically conductive leads; and
third and fourth electrically conductive leads disposed within the cryostat and connected to opposite ends of the electrically conductive coil,
wherein each of the third and fourth electrically conductive leads comprises a material which is superconducting at a temperature above 50° K,
wherein the third and fourth electrically conductive leads are anchored thermally to the cryogenic heat shield,
wherein the first and second electrically conductive leads are configured to be connected to the third and fourth electrically conductive leads, respectively, under control of the magnet controller in response to detecting that an operating fault exists in the apparatus, and are further configured to connect the third and fourth electrically conductive leads to the energy dump unit.

7. The apparatus of claim 6, further including at least one cooling fan which is supplied by a voltage across the energy dump unit and which is activated when the energy dump unit is connected across the electrically conductive coil in response to the detection of the operating fault.

8. The apparatus of claim 6, wherein the first and second electrically conductive leads are configured to connect the energy dump unit across the electrically conductive coil, wherein the first and second electrically conductive leads have first ends permanently disposed inside of the cryostat, and further have second ends permanently disposed outside of the cryostat.

9. The apparatus of claim 6, further comprising:
a cold head configured to cool the cryostat;
a compressor configured to drive the cold head;
an inner chamber within the cryostat; and
a first thermal insulation region disposed between the cryogenic heat shield and the inner chamber,
a second thermal insulation region disposed between an outer wall of the cryostat and the cryogenic heat shield;
wherein the at least one sensor includes at least one of: a first temperature sensor configured to measure a temperature of the electrically conductive coil, a second temperature sensor configured to measure a temperature of the cold head, a third temperature sensor configured to measure a temperature in one of the first and second thermal insulation regions, a sensor configured to monitor a level of cryogenic fluid within the cryostat, and a sensor configured to determine if the compressor is driving the cold head.

10. The apparatus of claim 9, further including at least one of a fluid sensor and a compressor sensor to determine if the compressor is properly driving the cold head.

11. An apparatus comprising:
an electrically conductive coil configured to produce a magnetic field when an electrical current is passed therethrough;
a persistent current switch connected across the electrically conductive coil and configured to be selectively activated and deactivated;
a cryostat having the electrically conductive coil and the persistent current switch disposed therein;
an energy dump unit;
a cold head configured to cool the cryostat;
a compressor configured to drive the cold head;
an inner chamber within the cryostat;
a thermal insulation region disposed between an outer wall of the cryostat and the inner chamber;
a first temperature sensor configured to measure a temperature of the electrically conductive coil,
a magnet controller configured to receive sensor signals and in response thereto to detect whether an operating fault exists in the apparatus, and when the operating fault is detected, to connect the energy dump unit across the electrically conductive coil so as to transfer energy from the electrically conductive coil to the energy dump unit, wherein the energy dump unit the energy outside of the cryostat in order to prevent a quench of the apparatus.

12. The apparatus of claim 11, further including at least one of: a second temperature sensor configured to measure a temperature of the cold head and a third temperature sensor configured to measure a temperature in the thermal insulation region.

13. The apparatus of claim 11, further including a sensor configured to monitor a level of cryogenic fluid within the cryostat.

14. The apparatus of claim 11, further including a sensor configured to determine if the compressor is driving the cold head.

15. The apparatus of claim 11, wherein the compressor is configured to receive power from AC Mains; and a backup power supply configured to supply power to the magnet controller when AC Mains incurs a power outage.

16. The apparatus of claim 11, wherein the apparatus is a magnetic resonance imaging (MRI) apparatus further comprising:
a patient table configured to hold a patient;
gradient coils configured to at least partially surround a portion of a patient for which the MRI apparatus generates an image;
a radio frequency coil configured to apply a radio frequency signal to the portion of a patient and to alter the alignment of this magnetic field; and
a scanner configured to detect changes in the magnetic field caused by the radio frequency signal.

17. The apparatus of claim 11, further comprising:
a second temperature sensor configured to measure a temperature of the cold head;
a third temperature sensor configured to measure a temperature in the thermal insulation region;
a cryogenic fluid level sensor configured to monitor a level of cryogenic fluid within the cryostat; and
a compressor sensor configured to determine if the compressor is driving the cold head.

18. A method of operating a magnet system including an electrically conductive coil disposed in a cryostat, first and second electrically conductive leads which are retractable and extendable, each of the first and second electrically conductive leads being configured in a retracted position to be disposed outside the cryostat, and in an extended position to extend into the cryostat and third and fourth electrically conductive leads, respectively, which are disposed within the cryostat and which are connected to opposite ends of the electrically conductive coil, the method comprising:

generating a persistent magnetic field with the electrically conductive coil;

monitoring a plurality of sensor signals, in response to at least one sensor signal from the plurality of sensor signals, detecting by a magnet processor whether an operating fault that may lead to a quench exists in the magnet system; and when the operating fault is detected:

automatically connecting an energy dump unit across the electrically conductive coil so as to transfer energy from the electrically conductive coil to the energy dump unit, and activating a heater in the persistent current switch connected across the electrically conductive coil in order to prevent the quench of the magnet system, wherein automatically connecting the energy dump unit across the electrically conductive coil comprises extending the first and second electrically conductive leads to engage with, and electrically connect to, the third and fourth electrically conductive leads, respectively.

19. The method of claim 18, wherein the energy dump unit is disposed outside of the cryostat, the method further including:

transferring heat from the energy dump unit to the cryostat.

20. The method of claim 18, further including in the absence of an operating fault, retracting the first and second electrically conductive leads to disengage from the third and fourth electrically conductive leads.

* * * * *